US007175964B2

(12) United States Patent
Kobayashi

(10) Patent No.: US 7,175,964 B2
(45) Date of Patent: Feb. 13, 2007

(54) PRINTING PLATE MATERIAL AND ITS DEVELOPING PROCESS

(75) Inventor: Yasunobu Kobayashi, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/035,968

(22) Filed: Jan. 18, 2005

(65) Prior Publication Data

US 2005/0214684 A1 Sep. 29, 2005

(30) Foreign Application Priority Data

Jan. 20, 2004 (JP) ............................ 2004-011505

(51) Int. Cl.
*G03F 7/09* (2006.01)
*G03F 7/30* (2006.01)

(52) U.S. Cl. .............................. 430/270.1; 430/278.1; 430/302; 430/309; 430/434; 430/435; 430/494; 430/944; 430/945

(58) Field of Classification Search ............. 430/270.1, 430/278.1, 302, 309, 434, 435, 494, 944, 430/945
See application file for complete search history.

(56) References Cited

U.S. PATENT DOCUMENTS

| | | | | |
|---|---|---|---|---|
| 3,181,461 A | | 5/1965 | Fromson | |
| 4,555,475 A | | 11/1985 | Gamson et al. | |
| 4,970,116 A | * | 11/1990 | Kimura et al. | 428/332 |
| 6,593,061 B2 | * | 7/2003 | Hotta | 430/278.1 |
| 6,692,890 B2 | * | 2/2004 | Huang et al. | 430/270.1 |
| 6,912,956 B2 | * | 7/2005 | Mori | 101/459 |
| 2005/0064328 A1 | * | 3/2005 | Goto | 430/270.1 |

FOREIGN PATENT DOCUMENTS

| | | | | |
|---|---|---|---|---|
| EP | 1 338 436 A2 | | 8/2003 |
| EP | 1 350 633 A2 | * | 10/2003 |
| EP | 1 219 464 A2 | * | 7/2005 |
| FR | 2780337 | | 12/1999 |

OTHER PUBLICATIONS

European Search Report dated May 4, 2005, for EP 05 10 0156.

* cited by examiner

*Primary Examiner*—Barbara L. Gilliam
(74) *Attorney, Agent, or Firm*—Finnegan, Henderson, Farabow, Garrett & Dunner, L.L.P.

(57) ABSTRACT

Disclosed is a manufacturing process of a printing plate material comprising a boehmite treated aluminum support, and provided thereon, an image formation layer containing water soluble resins or water dispersible resins, the process comprising the steps of surface roughening an aluminum plate, anodizing the surface roughened aluminum plate, boehmite treating the anodized aluminum plate to produce the boehmite treated aluminum support having boehmite protrusions with an average height of from 30 to 200 nm and an average base size of from 10 to 100 nm, coating a coating solution for the image formation layer on the resulting aluminum support to form a coated layer, and drying the coated layer to form the image formation layer on the aluminum support.

6 Claims, 2 Drawing Sheets

PRINTING PLATE MATERIAL AND ITS DEVELOPING PROCESS

FIELD OF THE INVENTION

The present invention relates to a printing plate material and its developing process, and particularly to a printing plate material capable of forming an image by a computer to plate (CTP) system and its developing process.

BACKGROUND OF THE INVENTION

Recently, accompanied with digitization of printing data, a printing plate material for CTP, which is inexpensive, can be easily handled and has a printing ability comparable with that of a PS plate, is required. Particularly, a versatile thermal processless printing plate material, which can be applied to a printing press employing a direct imaging (DI) process without development by a special developing agent and which can be treated in the same manner as in PS plates, has been required.

In a thermal processless printing plate material, an image is formed according to a recording method employing an infrared laser emitting light with infrared to near infrared wavelengths. The thermal processless printing plate material employing this recording method is divided into ablation type, heat fusible type, phase change type, and polymerization/cross-linking type.

Many ablation type printing plate materials have been disclosed (see, for example, Japanese Patent O.P.I. Publication Nos. 8-507727, 6-186750, 6-199064, 7-314934, 10-58636 and 10-244773). These references disclose a printing plate material comprising a substrate and a hydrophilic layer or a lipophilic layer, either of which is an outermost layer. In the printing plate material having a hydrophilic layer as an outermost layer, the hydrophilic layer is imagewise exposed to imagewise ablate the hydrophilic layer, whereby the lipophilic layer is exposed to form image portions.

As the heat fusible type printing plate material, there is one comprising a hydrophilic layer or a grained aluminum plate and provided thereon, an image formation layer containing thermoplastic particles, and a water soluble binder (see, for example, Japanese Patent Publication No. 2938397.). A planographic printing plate material "Thermo Lite" produced by Agfa Co., Ltd. is of this type. Since this type of printing plate material can form an image only by energy necessary to heat fuse, energy for image formation can be reduced and an image can be formed with high speed employing a high power laser.

As the phase change type thermal processless printing plate material, there is a printing plate material comprising a hydrophilic layer containing hydrophobic precursor particles which changes to be hydrophobic at exposed portions, the hydrophilic layer being not removed during printing (see, for example, Japanese Patent O.P.I. Publication No. 11-240270).

As the polymerization/cross-linking type thermal processless printing plate material, there are known printing plate materials (see, for example, U.S. Pat. No. 6,548,222). This type printing plate material employing a roughened surface of an aluminum support increases strength of the image formation layer due to formation of a three dimensional network structure, and exhibits high adhesion of the image formation layer to the support due to anchor effect of the layer with the increased strength, providing greatly improved printing durability.

These printing plate materials for CTP are ones providing a printing plate without development employing a specific processing agent. The influence of the surface configuration of the support on development, printing durability, and stain occurrence is far greater in these printing plate materials requiring no development than in a conventional PS plate, a thermal type CTP or a photopolymer type CTP each requiring development. When the surface of a conventional support is applied to a printing plate material for CTP, strength of an image formation layer and on-press developability are not balanced, providing a printing plate material which is incapable of being subjected to on-press development, or providing a printing plate which is likely to produce stain and is poor in printing durability.

Another prior art of the printing plate material is disclosed in Japanese Patent O.P.I. Publication Nos. 2000-255177 and No. 2001-71654.

SUMMARY OF THE INVENTION

An object of the invention is to provide a printing plate material providing prints with a sharp image, good on-press developability, high printing durability, print image with no stain at non-image portions, and excellent printability. Another object of the invention is to provide a developing process of the printing plate material.

DETAILED DESCRIPTION OF THE INVENTION

Figure 1:
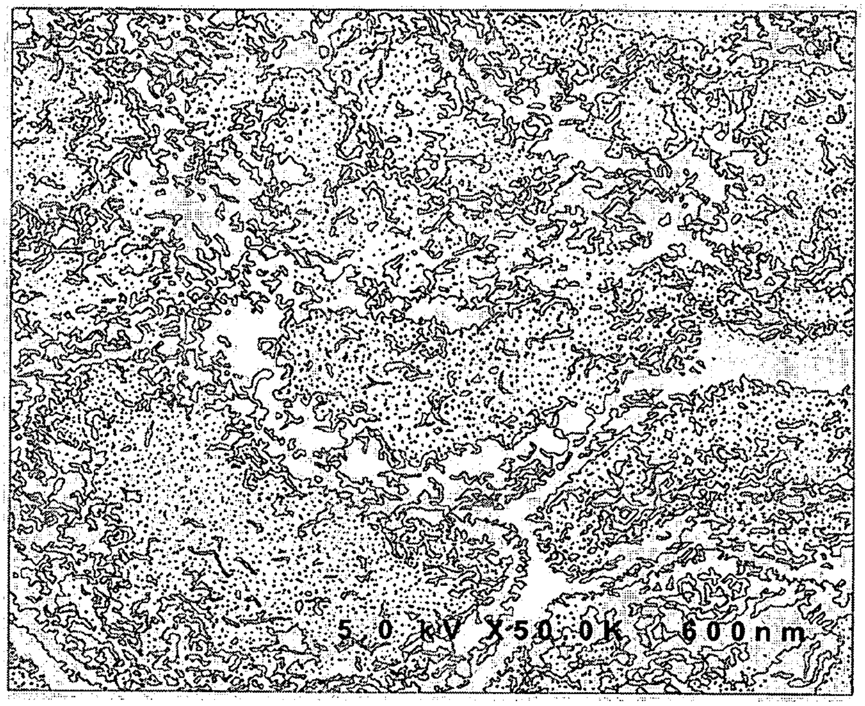
FIG. 1 is an electron micrograph of boehmite protrusions, which are forming on the aluminum plate surface.

The above object can be attained by the following constitution.

1. A manufacturing process of a printing plate material comprising a boehmite treated aluminum support, and provided thereon, an image formation layer containing water soluble resins or water dispersible resins, the process comprising the steps of surface roughening an aluminum plate, anodizing the surface roughened aluminum plate; boehmite treating the anodized aluminum plate to produce the boehmite treated aluminum support having boehmite protrusions with an average height of from 30 to 200 nm and an average base size of from 10 to 100 nm, coating a coating solution for the image formation layer on the resulting aluminum support to form a coated layer, and drying the coated layer to form the image formation layer on the aluminum support.

2. The manufacturing process of item 1 above, wherein a density of the boehmite protrusions is from 50 to 300 per 1 μm square (1 μm×1 μm).

3. The manufacturing process of item 1 above, wherein the boehmite treating is carried out by immersing the anodized aluminum plate in an aqueous solution with a pH of from 7 to 11 of ammonium acetate, sodium silicate, sodium nitrite, or dichromate.

4. The manufacturing process of item 3 above, wherein the anodized aluminum plate is immersed in the aqueous solution at 70 to 100° C. for 5 to 120 seconds.

5. The manufacturing process of item 1 above, further comprising the step of treating the boehmite treated aluminum plate with a hydrophilic compound.

6. The manufacturing process of item 1 above, wherein the image formation layer contains a light-to-heat conversion material.

7. The manufacturing process of item 1 above, wherein the water soluble reins or water dispersible resins are in the form of particles.

8. A process of developing the printing plate material of item 1 above, the process comprising the steps of mounting the printing plate material on a plate cylinder of the printing press, and carrying out on-press development by supplying a dampening solution and/or printing ink to the printing plate material.

9. A printing plate material manufactured according to the process of item 1 above.

1-1 A printing plate material comprising a surface roughened aluminum support having boehmite protrusions with a height of from 30 to 200 nm, and provided thereon, an image formation layer containing a thermally polymerizable compound or a thermally cross-linkable compound, wherein the support is obtained by a process comprising the steps of surface roughening an aluminum plate and then boehmite treating the surface roughened aluminum plate to produce the boehmite protrusions on the surface of the aluminum plate.

1-2 The printing plate material of item 1-1 above, wherein the process further comprises the step of treating the boehmite treated aluminum plate with a hydrophilic compound.

1-3 The printing plate material of item 1 or 2 above, wherein the process further comprises the step of providing a coating solution for the image formation layer, coating the coating solution on the aluminum support, and drying to form the image formation layer, in which the thermally polymerizable compound or the thermally cross-linkable compound of the formed image formation layer does not form a film.

1-4 A process of developing the printing plate material of items 1 through 3 above, the process comprising the steps of mounting the printing plate material on a printing press, and on-press developing the mounted printing plate material on the press.

Next, the present invention will be explained in detail. The printing plate material of the invention comprises a surface roughened aluminum plate and provided thereon, an image formation layer, wherein the printing plate material is capable of being subjected to on-press development.

In the invention, "on-press development" means that when an exposed printing plate material being mounted on a plate cylinder of a printing press (for example, a conventional off-set printing press), printing is carried out, the image formation layer at unexposed portions is removed in an initial printing stage by printing ink and/or a dampening solution supplied to the printing plate material surface.

(Aluminum Support)

As material for the aluminum support in the invention, any known aluminum plates used as a support for a planographic printing plate material can be used. The thickness of the aluminum plate is not specifically limited as long as it is such a thickness that can be mounted on a plate cylinder of a printing press, but is preferably from 50 to 500 μm.

The aluminum plate is used after the surface of the aluminum plate is degreased by bases, acids or solvents to remove oil remaining on the plate surface which has been used during rolling or winding up. Degreasing is preferably carried out in an aqueous alkali solution. A surface roughened aluminum plate is used. There are various surface roughening methods of the aluminum plate such as a mechanically surface roughening method, an electrochemically etching method, and a chemically etching method. Examples of the mechanically surface roughening method include a ball graining method, a brush graining method, a blast graining method, and a buffing graining method. The electrochemically etching method is ordinarily carried out in a hydrochloric acid or nitric acid solution, employing an alternating current or a direct current. There are methods disclosed in Japanese Patent O.P.I. Publication No. 54-63902, in which the both methods are combined. It is preferred that the thus surface roughened aluminum plate is optionally subjected to alkali etching treatment and neutralization treatment, and then to anodization treatment in order to enhance water retention and abrasion resistance of the plate surface. As an electrolyte used in the anodization treatment, there are various ones forming a porous film. Examples thereof include sulfuric acid, phosphoric acid, oxalic acid, chromic acid and their mixture. The concentration of the electrolyte in the electrolytic solution is suitably determined according to kinds of electrolytes used.

The anodization conditions cannot be limited since they vary according to kinds of an electrolytic solution used. However, it is preferred that anodization is carried out in an electrolytic solution containing an electrolyte in an amount of 1 to 80% ny weight at 5 to 70° C. for from 10 seconds to 5 minutes at a current density of from 5 to 60 $A/dm^2$ and at a voltage of from 1 to 100V. The amount of the formed anodization film is preferably from 1 to 10 $g/m^2$. This amount range of the anodization film is preferred in view of high printing durability or resistance to stain.

Figure 2:
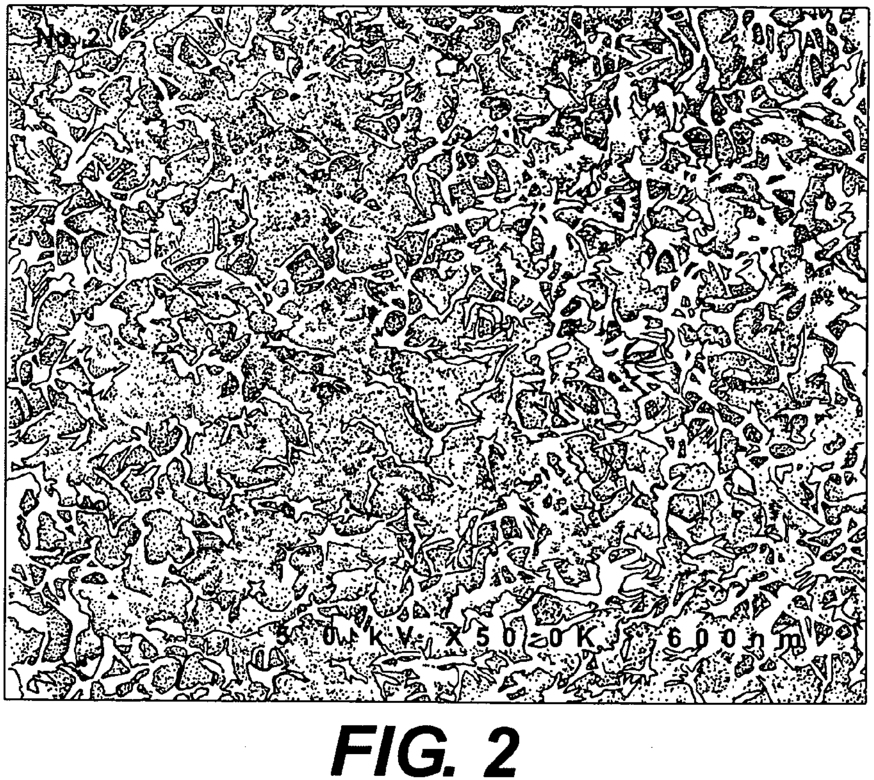
FIG. 2 is an electron micrograph of boehmite protrusions formed on the aluminum plate surface.

In the invention, the anodized aluminum plate is boehmite treated to produce the boehmite treated aluminum support having boehmite protrusions with an average height of from 30 to 200 nm and an average base size of from 10 to 100 nm. Thus, the aluminum support in the invention is obtained. As to the boehmite treatment after anodization, there is a method in which an anodized aluminum plate is treated with hot water or steam, and preferably a method in which the anodized aluminum plate is immersed in an aqueous solution of ammonium acetate, sodium silicate, sodium nitrite, or dichromate. The temperature during boehmite treatment is preferably from 70 to 100° C., and more preferably from 75 to 90° C., and time required for the treatment is preferably from 5 to 120 seconds, and more preferably from 10 to 90 seconds. The pH of the aqueous solution is preferably from 7 to 11, and more preferably from 7.5 to 10.5. These boehmite treatment conditions initiate formation of boehmite protrusions as shown in FIG. 1 on the surface of an aluminum plate, and provide the boehmite protrusions in the invention as shown in FIG. 2. These boehmite treatment conditions also provide a boehmite structure $[Al_2O_3(H_2O)]$ on the surface of the aluminum plate. The average height of the boehmite protrusions is from 30 to 200 nm, and preferably from 50 to 150 nm, and the average base size of the boehmite protrusions is from 10 to 100 nm, and preferably from 20 to 90 nm. The density of the boehmite protrusions is preferably from 50 to 300 per 1 μm square (1 μm×1 μm), and more preferably from 100 to 250 per 1 mm square (1 μm×1 μm).

Figure 3:
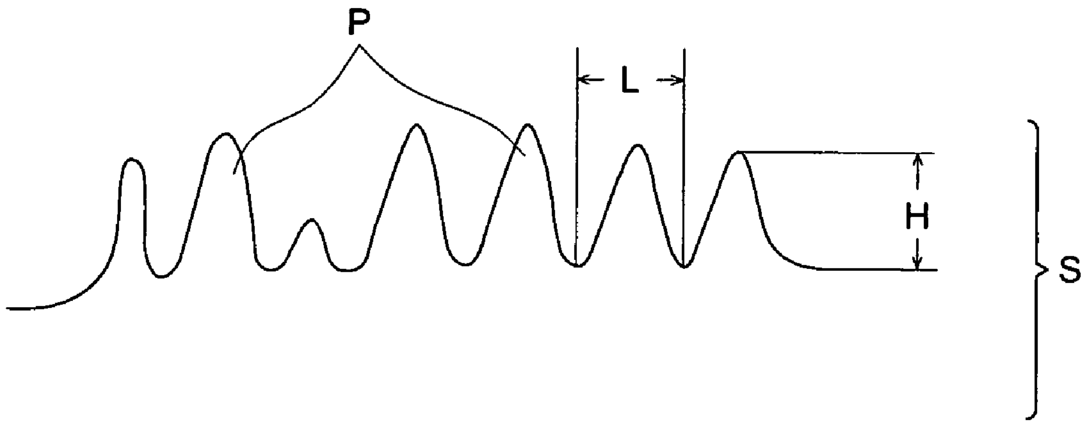
FIG. 3 is a sectional view of the boehmite treated aluminum support of the invention.

In the invention, the height and base size of boehmite protrusions of the boehmite treated aluminum support will be explained employing FIG. 3. In the sectional view of the boehmite treated aluminum support S of FIG. 3, L represents the base size of the boehmite protrusions P, and H represents the height of the boehmite protrusions P.

In the invention, the height and base size of the boehmite protrusions are measured using an SEM photograph of a cross section of the boehmite treated aluminum support. In the invention, the average height of the boehmite protrusions refrs to the average of the heights of arbitrarily selected 50 protrusions in the SEM photograph of the cross section, and the average base size of the boehmite protrusions refers to the average of the base sizes of arbitrarily selected 50 protrusions in an SEM photograph of the cross section of the boehmite treated aluminum support. Herein, the SEM photograph was taken by means of a scanning electron microscope S-800 (produced by Hitachi Seisakusho Co., Ltd.) at a magnification of 50,000.

After the boehmite treatment, the aluminum plate may be immersed in a hydrophilic compound-containing solution. Examples of the hydrophilic compound include citric acid, carboxymethylcellulose, chitosan, pullulan, alginic acid, oxalic acid, phthalic acid, formic acid, phytic acid, ammonium hexafluorophosphate, glycine, polyvinyl phosphonic acid, saccharides, or their sodium salts. The pH of this solution is preferably from 7 to 11. The aluminum plate is immersed in this solution at preferably from 60 to 100° C. for preferably from 5 to 120 seconds.

A backcoat layer is preferably provided on the rear surface of the aluminum plate opposite the boehmite treated surface in order to control (for example, to reduce its friction of a plate cylinder surface) slippage of the rear surface.

(Light-to-heat Conversion Material)

The image formation layer of the printing plate material of the invention contains a light-to-heat conversion material. As preferred examples of the light-to-heat conversion material, there are the following compounds.

As general infrared absorbing dyes, there are a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound and an indoaniline compound. Exemplarily, there are those compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Compounds described in Japanese Patent O.P.I. Publication Nos. 11-240270, 11-265062, 2000-309174, 2002-49147, 2001-162965, 2002-144750, and 2001-219667 can be preferably used.

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm.

The graphite is one having a particle size of preferably not more than 0.5 μm, more preferably not more than 100 nm, and most preferably not more than 50 nm.

As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials, which are electro-conductive or semiconductive, can be used. Examples of the former include black iron oxide and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3 \cdot 2B_2O$ and $K_2O \cdot nTiO_2$ with these metal oxides is usable. These oxides are particles having a particle size of not more than 0.5 μm, preferably not more than 100 nm, and more preferably not more than 50 nm.

As these light-to-heat conversion materials, black iron oxide or black complex metal oxides containing at least two metals are more preferred.

The black iron oxide ($Fe_3O_4$) particles have an average particle size of from 0.01 to 1 μm, and an acicular ratio (major axis length/minor axis length) of preferably from 1 to 1.5. It is preferred that the black iron oxide particles are substantially spherical ones (having an acicular ratio of 1) or octahedral ones (having an acicular ratio of 1.4).

Examples of the black iron oxide particles include for example, TAROX series produced by Titan Kogyo K.K. Examples of the spherical particles include BL-100 (having a particle size of from 0.2 to 0.6 μm, and BL-500 (having a particle size of from 0.3 to 1.0 μm. Examples of the octahedral particles include ABL-203 (having a particle size of from 0.4 to 0.5 μm, ABL-204 (having a particle size of from 0.3 to 0.4 μm, ABL-205 (having a particle size of from 0.2 to 0.3 μm, and ABL-207 (having a particle size of 0.2 μm.

The black iron oxide particles may be surface-coated with inorganic compounds such as $SiO_2$. Examples of such black iron oxide particles include spherical particles BL-200 (having a particle size of from 0.2 to 0.3 μm) and octahedral particles ABL-207A (having a particle size of 0.2 μm), each having been surface-coated with $SiO_2$.

Examples of the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light-to-heat conversion efficiency as compared with another metal oxide.

The primary average particle size of these complex metal oxides is preferably not more than 1.0 μm, and more preferably from 0.01 to 0.5 μm. The primary average particle size of not more than 1.0 μm improves light-to-heat conversion efficiency relative to the addition amount of the particles, and the primary average particle size of from 0.01 to 0.5 μm further improves light-to-heat conversion efficiency relative to the addition amount of the particles.

The light-to-heat conversion efficiency relative to the addition amount of the particles depends on a dispersity of the particles, and the well-dispersed particles have a high light-to-heat conversion efficiency. Accordingly, these complex metal oxide particles are preferably dispersed according to a known dispersing method, separately, to obtain a dispersion liquid (paste), before being added to a coating liquid for the particle containing layer. A dispersant is optionally used as a dispersion auxiliary. The addition amount of the dispersant is preferably from 0.01 to 5% by weight, and more preferably from 0.1 to 2% by weight, based on the weight of the complex metal oxide particles.

In the invention, of these, a dye is preferably used, and a dye having less color is more preferably used.

(Image Formation Layer)

The image formation layer in the invention is preferably one, which forms an image by heat generated due to infrared laser light exposure. The image formation layer preferably contains water soluble or water dispersible resins.

It is preferred that the image formation layer contains water soluble reins or water dispersible resins in the form of particles.

Examples of the water soluble or water dispersible resins include oil-modified alkyd resins, vinyl-modified alkyd resins, epoxy-modified alkyd resins, melamine resin, silicon-acryl resin, epoxyacryl resin, acryl resin, phenol resin, epoxy resin, urethane resin, isocyanates, carbodiimides, oligosaccharides, polysaccharides, polyethylene oxide, polypropylene oxide, polyvinyl alcohol, polyethylene glycol (PEG), polyvinyl ether, PVA-acryl resin, acrylate copolymer, styrene-acrylate copolymer, styrene-butadiene copolymer, conjugation diene polymer latex of methyl methacrylate-butadiene copolymer, acryl polymer latex, vinyl polymer latex, polyacrylic acid salts, polyacrylamide, and polyvinyl pyrrolidone, styrene-acrylate copolymers, acrylate copolymers, and PVA/acrylic resin. The image formation layer can also contain monomers or oligomers. Examples of the monomers include monomethacrylate, monoacrylate, dimethacrylate, diacrylate, triacrylate, triester, tetracrylate, hexacrylate, urethane(meth)acrylate, and epoxy acrylate. Examples of the oligomers include oligomers of the monomers described above. Among these, water-soluble ones are preferred.

The content of the water soluble or water dispersible resins image formation layer is preferably from 1 to 90% by weight, and more preferably from 5–80% by weight.

The image formation layer of the printing plate material can comprise heat melting particles or heat fusible particles. These are particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include waxes such as paraffin wax, polyolefin wax, polyethylene wax, microcrystalline wax, fatty acid ester wax and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene wax, microcrystalline wax, fatty acid ester wax and fatty acid wax are preferably contained. High sensitive image formation can be performed since these materials each have a relative low melting point and a low melt viscosity. These materials each have a lubricating ability. Accordingly, even when a shearing force is applied to the surface layer of the printing plate precursor, the layer damage is minimized, and resistance to stain, which may be caused by scratch, is further enhanced.

The heat melting particles are preferably dispersible in water. The average particle size thereof is preferably from 0.01 to 10 μm, and more preferably from 0.1 to 3 μm. The above average particle size range of the heat melting particles is preferred in view of on-press developability, resistance to stains, or resolution.

The composition of the heat melting particles may be continuously varied from the interior to the surface of the particles.

The particles may be covered with a different material. Known microcapsule production method or sol-gel method can be applied for covering the particles. The heat melting particle content of the layer is preferably 1 to 90% by weight, and more preferably 5 to 80% by weight based on the total layer weight.

The heat fusible particles include thermoplastic hydrophobic polymer particles. Although there is no specific limitation to the upper limit of the softening point of the thermoplastic hydrophobic polymer, the softening point is preferably lower than the decomposition temperature of the polymer. The weight average molecular weight (Mw) of the thermoplastic hydrophobic polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co)polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm. The above average particle size range of the heat melting particles is preferred in view of on-press developability, resistance to stains, or resolution.

Further, the composition of the heat fusible particles may be continuously varied from the interior to the surface of the particles. The particles may be covered with a different material. As a covering method, known methods such as a microcapsule method and a sol-gel method are usable. The heat fusible particle content of the layer is preferably from 1 to 90% by weight, and more preferably from 5 to 80% by weight based on the total weight of the layer.

The image formation layer can further contain the light-to-heat conversion material described above. The image formation layer can further contain a water-soluble surfactant. A silicon atom-containing surfactant and a fluorine atom-containing surfactant can be used. The silicon atom-containing surfactant is especially preferred in that it minimizes printing contamination. The content of the surfactant is preferably from 0.01 to 3.0% by weight, and more preferably from 0.03 to 1.0% by weight based on the total weight of the image formation layer (or the solid content of the coating liquid).

The image formation layer can contain an acid (phosphoric acid or acetic acid) or an alkali (sodium hydroxide, silicate, or phosphate) to adjust pH.

The coating amount of the image formation layer is from 0.01 to 10 $g/m^2$, preferably from 0.1 to 3 $g/m^2$, and more preferably from 0.2 to 2 $g/m^2$.

In the invention, the image formation layer is firmly adhered to the boehmite surface of the aluminum support on exposure by a laser with an emission wavelength of from 700 to 1100 nm.

(Protective Layer)

A protective layer can be provided as an upper layer for example, on the image formation layer.

As materials in the protective layer, the water soluble resin or the water dispersible resin described above can be preferably used. The protective layer in the invention may be a hydrophilic overcoat layer disclosed in Japanese Patent O.P.I. Publication Nos. 2002-19318 and 2002-86948. The coating amount of the protective layer is from 0.01 to 10 $g/m^2$, preferably from 0.1 to 3 $g/m^2$, and more preferably from 0.2 to 2 $g/m^2$.

(On-Press Development)

In the invention, the image formation layer, where polymerization or cross-linking occurs on exposure by for example, infrared laser, form oleophilic image portions at laser exposed portions where polymerization or cross-linking occurs, and the image formation layer at unexposed portions are removed to form non-image portions. Removal of the image formation layer can be carried out by washing with water, and can be also carried out by supplying a dampening solution and/or printing ink to the image formation layer on a press (so-called on-press development).

Removal on a press of the image formation layer at unexposed portions of a printing plate material, which is mounted on the plate cylinder, can be carried out by bringing a dampening roller and an inking roller into contact with the image formation layer while rotating the plate cylinder, and can be also carried out according to various sequences such as those described below or another appropriate sequence. The supplied amount of dampening solution may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

EXAMPLES

The present invention will be explained below employing examples, but is not limited thereto. Example 1

(Preparation of Support A-1)

A 0.24 mm thick aluminum plate (material 1050, refining H16) was immersed in an aqueous 1% by weight sodium hydroxide solution at 50° C. to give an aluminum dissolution amount of 2 $g/m^2$, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 $A/dm^2$ employing an alternating current with a sine waveform, in which the distance between the plate surface and the electrode was 10 mm. The electrolytic surface-roughening treatment was divided into 12 treatments, in which the quantity of electricity used in one treatment (at a positive polarity) was 40 $C/dM^2$, and the total quantity of electricity used (at a positive polarity) was 480 $C/dm^2$. Standby time of 5 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an aluminum etching amount (including smut produced on the surface) of 1.2 $g/m^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 $C/dm^2$ was supplied, and washed with water. Thus, Support A-1 was prepared.

(Support A-2)

Support A-1 was further immersed in an aqueous 0.1% ammonium acetate solution at 85° C. for 5 seconds. Thus, Support A-2 was prepared. The average height and average base size of the boehmite protrusions were measured using an SEM photograph of the cross section of the resulting support, which was taken by a scanning electron microscope S-800 (produced by Hitachi Seisakusho Co., Ltd.) at a magnification of 50,000, and as a result, the average height of the protrusions was 20 nm, and the average base size of the protrusions was 5 nm.

(Support A-3)

Support A-1 was further immersed in an aqueous 0.1% ammonium acetate solution at 85° C. for 15 seconds. Thus, Support A-3 was prepared. The average height and average base size of the boehmite protrusions were measured using an SEM photograph of the cross section of the resulting support, which was taken by a scanning electron microscope S-800 (produced by Hitachi Seisakusho Co., Ltd.) at a magnification of 50,000, and as a result, the average height of the protrusions was 120 nm, and the average base size of the protrusions was 60 nm.

(Support A-4)

Support A-1 was further immersed in an aqueous 0.1% ammonium acetate solution at 95° C. for 60 seconds. Thus, Support A-4 was prepared. The average height and average base size of the boehmite protrusions were measured using an SEM photograph of the cross section of the resulting support, which was taken by a scanning electron microscope S-800. (produced by Hitachi Seisakusho Co., Ltd.) at a magnification of 50,000, and as a result, the average height of the protrusions was 250 nm, and the average base size of the protrusions was 110 nm.

(Support A-5)

Support A-1 was further immersed in an aqueous 0.1% carboxymethylcellulose sodium salt solution at 90° C. for 30 seconds. Thus, Support A-5 was prepared.

(Support A-6)

Support A-2 was further immersed in an aqueous 0.1% carboxymethylcellulose sodium salt solution at 90° C. for 30 seconds. Thus, Support A-6 was prepared.

(Support A-7)

Support A-3 was further immersed in an aqueous 0.1% carboxymethylcellulose sodium salt solution at 90° C. for 30 seconds. Thus, Support A-7 was prepared.

(Support A-8)

Support A-4 was further immersed in an aqueous 0.1% carboxymethylcellulose sodium salt solution at 90° C. for 30 seconds. Thus, Support A-8 was prepared.

(Preparation of Image Formation Layer)

(Image formation layer coating solution P-1)

| | |
|---|---|
| Aqueous polymer dispersion, NK polymer RP-116E (produced by Sinnakamura Kagaku Co., Ltd., solid content: 35% by weight) | 26.3 weight parts |
| Aqueous solution of sodium acrylate, AQUALIC DL522 (produced by Nippon Shokubai Co., Ltd., solid content: 10% by weight) | 10.0 weight parts |
| 1% by weight ethanol solution of light-to-heat conversion dye, ADS 830AT (produced by American Dye Source Co., Ltd.) | 30.0 weight parts |
| Pure water | 33.7 weight parts |

(Image formation layer coating solution P-2)

| | |
|---|---|
| Aqueous polyurethane dispersion, Takelac W-615 (produced by Mitsui Takeda Chemical Co., Ltd., average particle size: 80 nm, solid content: 35% by weight) | 17.1 weight parts |
| Aqueous block isocyanate, Takenate XWB-72-N67 (produced by Mitsui Takeda Chemical Co., Ltd., solid content: 45% by weight) | 7.1 weight parts |
| Aqueous solution of sodium acrylate, AQUALIC DL522 (produced by Nippon Shokubai Co., Ltd., solid content: 10% by weight) | 5.0 weight parts |
| 1% by weight ethanol solution of light-to-heat conversion dye, ADS 830AT (produced by American Dye Source Co., Ltd.) | 30.0 weight parts |
| Pure water | 40.8 weight parts |

Preparation of Printing Plate Material Samples 1 Through 9

The resulting image formation layer coating solution was coated on the support obtained above, employing a wire bar, dried at 55° C. for 3 minutes to give an image formation layer with a dry thickness of 1.50 g/m$^2$, and further subjected to aging at 40° C. for 24 hours. Thus, printing plate material samples 1 through 9 having a structure as shown in Table 1 were prepared.

After coated and dried, the image formation layer coating solution P-1 formed an image formation layer as a continuous phase. While after coated and dried, the image formation layer coating solution P-2 did not form a continuous phase image formation layer, but formed a discontinuous phase image formation layer in which the polyurethane existed in the form of particles.

(Image Formation Employing Infrared Laser)

Each of the resulting printing plate samples was wound around an exposure drum and imagewise exposed. Exposure was carried out employing an infrared laser (having a wavelength of 830 nm and a beam spot diameter of 18 μm) at a resolution of 2400 dpi and at a screen line number of 175 to form a solid image, a dot image with a dot area of 1 to 99%, and a line and space image of 2400 dpi. In the exposure, the exposure energy was 250 mJ/cm$^2$. The term, "dpi" shows the number of dots per 2.54 cm.

(Printing Method)

The exposed printing plate material was mounted on a plate cylinder of a printing press and then printing was carried out in the same printing sequence as a conventional PS plate. Printing was carried out employing a printing press, DAIYA 1F-1 produced by Mitsubishi Jukogyo Co., Ltd., and employing a coated paper, a dampening solution, a 2% by weight solution of Astromark 3 (produced by Nikken Kagaku Kenkyusyo Co., Ltd.), and printing ink (TK Hyunity Magenta, produced by Toyo Ink Manufacturing Co.).

(Evaluation)

Initial Printability

The smallest number of paper sheets printed from when printing started till when good image (with an ink density of 1.6 at image portions and an optical density of 0.08 at non-image portions) was obtained was counted and evaluated as a measure of initial printability. A sample providing the smallest number of not more than 20 was evaluated as acceptable. Herein, the optical density was measured through a densitometer, Macbeth RD918 (produced by Macbeth Co., Ltd.) at a mode of M.

Printing Durability

The exposed printing plate material was mounted on a The number of paper sheets, printed from when printing started till when dots of the image with a dot area of 3% began lacking, was counted, and evaluated as a measure of printing durability. A sample providing the number of not less than 100,000 was evaluated as acceptable.

Stain at Non-Image Portions

An optical density at non-image portions (corresponding to unexposed portions) of prints was measured through Macbeth RD918 at a mode of M. A sample providing an optical density of less than 0.10 was evaluated as acceptable.

The results are shown in Table 1.

TABLE 1

| Sample No. | Support Used | Image Formation Layer Coating Solution Used | Initial Print-ability (Number) | Printing Dura-bility | Stain at Non-Image Portions | Re-marks |
|---|---|---|---|---|---|---|
| 1 | A-1 | P-1 | 16 | 30,000 | 0.07 | Comp. |
| 2 | A-2 | P-1 | 17 | 45,000 | 0.08 | Comp. |
| 3 | A-3 | P-1 | 18 | Not less than 100,000 | 0.09 | Inv. |
| 4 | A-4 | P-1 | 42 | Not less than 100,000 | 1.15 | Comp. |
| 5 | A-5 | P-1 | 15 | 31,000 | 0.07 | Comp. |
| 6 | A-6 | P-1 | 16 | 45,000 | 0.07 | Comp. |
| 7 | A-7 | P-1 | 16 | Not less than 100,000 | 0.08 | Inv. |
| 8 | A-8 | P-1 | 39 | Not less than 100,000 | 1.12 | Comp. |
| 9 | A-7 | P-2 | 9 | Not less than 100,000 | 0.08 | Inv. |

Inv.: Inventive,
Comp.: Comparative

As is apparent from Table 1 above, inventive samples provide prints with a sharp image, good on-press developability, high printing durability, print image with no stain at non-image portions, and excellent printability.

What is claimed is:

1. A manufacturing process of a printing plate material comprising a boehmite treated aluminum support, and provided thereon, an image formation layer containing water soluble resins or water dispersible resins in the form of particles, the process comprising the steps of:

surface roughening an aluminum plate;

anodizing the surface roughened aluminum plate;

boehmite treating the anodized aluminum plate to produce the boehmite treated aluminum support having boehmite protrusions with an average height of from 30 to 200 nm and an average base size of from 10 to 100 nm;

coating a coating solution for the image formation layer on the resulting aluminum support to form a coated layer; and drying the coated layer to form the image formation layer on the aluminum support, wherein the boehmite treating is carried out by immersing the anodized aluminum plate at 75 to 90° C. for 10 to 90 seconds in an aqueous solution with a pH of from 7 to 11 of ammonium acetate, sodium silicate, sodium nitrite, or dichromate.

2. The manufacturing process of claim 1, wherein a density of the boehmite protrusions is from 50 to 300 per 1 μm square (1 μm×1 μm).

3. The manufacturing process of claim 1, further comprising the step of treating the boehmite treated aluminum plate with a hydrophilic compound.

4. The manufacturing process of claim 1, wherein the image formation layer contains a light-to-heat conversion material.

5. A process of developing the printing plate material of claim 1, the process comprising the steps of:

exposing the printing plate material to form an exposed printing plate material;

mounting the exposed printing plate material on a plate cylinder of the printing press; and carrying out on-press development by supplying a dampening solution and/or printing ink to the exposed printing plate material.

6. A printing plate material manufactured according to the process of claim 1.

* * * * *